(12) United States Patent
Idgunji et al.

(10) Patent No.: US 8,717,078 B2
(45) Date of Patent: May 6, 2014

(54) SEQUENTIAL LATCHING DEVICE WITH ELEMENTS TO INCREASE HOLD TIMES ON THE DIAGNOSTIC DATA PATH

(75) Inventors: Sachin Satish Idgunji, San Jose, CA (US); Robert Campbell Aitken, San Jose, CA (US); Imran Iqbal, Milpitas, CA (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 13/495,362

(22) Filed: Jun. 13, 2012

(65) Prior Publication Data
US 2013/0335128 A1 Dec. 19, 2013

(51) Int. Cl.
*H03K 3/289* (2006.01)
(52) U.S. Cl.
USPC .......................................................... 327/202
(58) Field of Classification Search
USPC .......................................................... 327/202
See application file for complete search history.

(56) References Cited

U.S. PATENT DOCUMENTS

2006/0095819 A1  5/2006  Bhatia
2008/0284480 A1* 11/2008  Ahmadi ........................ 327/210

OTHER PUBLICATIONS

S. Arasu T. et al, "A Low Power and Low Cost Scan Test Architecture for Multi-Clock Domain SoCs using Virtual Divide and Conquer" International Test Conference, IEEE, 2005, pp. 1-9.

* cited by examiner

*Primary Examiner* — Daniel Rojas
(74) *Attorney, Agent, or Firm* — Nixon & Vanderhye P.C.

(57) ABSTRACT

A latching device includes input and output latching elements to receive and output data values wherein the input and output elements are configured to receive a first and second clocks, respectively. The clocks have the same frequency but are inverted. The elements are transparent and transmit data between an input and an output in response to the first value of a received clock and are opaque and hold the data value in response to a second value of the received clock, such that in response to the first and second clocks the input data value is clocked through the input and output elements to the output. The device includes a device for selecting an operational data value or a diagnostic data value for input to the input element in response to a value of a diagnostic enable signal indicating a functional mode or a diagnostic mode.

18 Claims, 9 Drawing Sheets

(Background)

| 1 | SE=0 | NRET=1 | Balloon latch transparent for functional state (MSTR) |
|---|------|--------|-------------------------------------------------------|
| 2 | SE=0 | NRET=0 | Balloon latch opaque stores functional state |
| 3 | SE=1 | NRET=1 | Balloon latch in scan shift mode retimes SI |
| 4 | SE=1 | NRET=0 | Stays in #3 |

FIG. 6b

SEQUENTIAL LATCHING DEVICE WITH ELEMENTS TO INCREASE HOLD TIMES ON THE DIAGNOSTIC DATA PATH

TECHNICAL FIELD

The technical field relates to data processing and in particular, to sequential elements in data processing circuits.

BACKGROUND

Sequential storage circuits that store data in response to a clock signal in data processing circuits are known. These circuits include latch circuits and flip flops and are very important elements of a processing circuit from both a delay and energy standpoint. Flip flops can take the form of master slave latches which input the data to the master latch during the first phase of the clock cycle and transfer it to the slave latch during the second phase of the clock cycle. This makes them look as though they store data in response to an edge, in other words they appear edge triggered, although in effect the latches are transparent in response to one phase of the clock cycle and opaque in response to the other, so the storage element can receive the data during one phase and then be isolated from the input during the other.

These devices are used to store operational or functional data during processing and they are also often used to store diagnostic data. In such cases they often operate in one of two modes, these being diagnostic mode and operational mode. Such a flip flop traditionally has a scan input and a data input. The scan input receiving diagnostic data and the operational input receiving operational data. The mode of operation is controlled by a scan enable signal, the diagnostic mode being entered when the scan enable signal is high and in this mode diagnostic data is received, stored and output. When the scan enable signal is low operational data is received, stored and output instead.

FIG. 1 shows how a signal travelling between a flip flop 10 termed the source flip flop and a further flip flop 20 termed the destination flip flop follows either an operational data path where it passes through combinational circuitry 25 where data processing operations occurs or along a diagnostic data path where it is transmitted directly to the destination flip flop 20. Thus, depending on the mode of operation either a data value D or a diagnostic data value SI are selected by the source flip flop for transmission in response to a clock signal CLK.

If diagnostic mode of operation is selected then the scan enable SE signal is high and multiplexer 12 selects the data output from the source flip flop 10 to follow the diagnostic data path 13 directly to the destination flip flop 20. As this data path has no combinational logic on it then if the clock signals are not perfectly aligned and the destination clock has a slight delay with respect to the source clock, then if the clock at the destination flip flop 20 goes high making the master latch within the flip flop transparent and allowing data at the input to be received, before the clock at the source flip flop 10 goes high and becomes opaque, then the old data value will be captured rather than the new data value. This is shown by the illegal arrow on the timing diagram. This is called a hold timing violation and occurs on the scan or diagnostic data path owing to the lack of elements on this path that allows data to be transmitted very quickly. The hold time is the amount of time the data should be held steady after the clock event to ensure that it is reliably sampled.

This problem has been addressed in devices of the prior art by providing inverters on the diagnostic data paths that buffer the signal and introduce a time delay. A drawback with this is that as the number of sequential elements in a circuit increases then so too do the number of buffers required to buffer this value and this can lead to significant effects on the area of the resulting circuit. Given that these buffers are only there to enable the scan path to function correctly this is a large overhead for a relatively unimportant function.

A further way of addressing this problem has been to insert a lock up latch between the two latches of the flip flop which introduces a delay. A drawback of this is that it is an external separate clocked element and the clocks need balancing.

SUMMARY

A first aspect of the present invention provides a latching device configured to receive, hold and output a data value in response to a clock signal, said clock signal periodically switching between a first and a second value, said latching device comprising:

an input latching element configured to receive an input data value; and an output latching element configured to output said data value; wherein said input latching element is configured to receive a first clock signal and said output latching element is configured to receive a second clock signal, said first and second clock signals having a same frequency and phase but being inverted with respect to each other; wherein said input and output latching elements are each configured to be transparent and transmit data between an input and an output in response to said first value of a received clock signal and being opaque and holding said data value in response to a second value of said received clock signal, such that in response to said first and second clock signals said input data value is clocked through said input and output latching elements to said output; said latching device further comprising:

a selecting device for selecting an operational data value or a diagnostic data value for input to said input latching element in response to a value of a diagnostic enable signal indicating a functional mode or a diagnostic mode; and a further latching element configured to be clocked by said second clock signal and being configured to be transparent and transmit data between an input and an output in response to said second clock signal having said first value and being opaque and holding said data value in response to said second clock signal having said second value.

The present technique recognises that latching devices that can operate in either functional or diagnostic mode may have hold timing problems when operating in diagnostic mode as the diagnostic path between the latching elements will be a direct path not passing through combinational circuitry and therefore any variations in the clock signals between the latching devices may cause the destination latch to receive a data signal too early such that an old data signal is clocked in instead of the new data signal. The present technique addresses this problem by the use of a further latching element. This further latching element is clocked with the same clock that the output latching element is clocked with, which means that it is opaque when the input latching element is transparent and transparent when the input latching element is opaque and is placed at the diagnostic input to the latching device. This means that there is a delay introduced before diagnostic data input at the diagnostic data input will reach the input latching element as it must pass through this oppositely clocked element first. This delay addresses the problem of hold time violations and yet only introduces an additional half clock cycle delay into the system such that data is still output in the same clock cycle. The set up time for this latching device is increased by half a clock cycle but as it is only operational in the diagnostic mode where clock frequencies are low this is not a problem.

Thus, by the addition of a single latch an elegant solution to the hold timing violation problem is produced which uses the properties of oppositely clocked latching elements to delay the diagnostic signal input to the latching device in a consistent and repeatable manner.

In some embodiments said further latching element is configured to receive said second clock signal in response to said diagnostic enable signal indicating said diagnostic mode.

The second clock signal may be input to the further latching element constantly or it may only be input in response to the diagnostic enable signal indicating the diagnostic mode. The latter is more power efficient but requires additional circuitry.

In some embodiments, said input latching element is a master latch and said output latching element is a slave latch, said further latching element being configured to operate in response to a same clock signal as said slave latch.

The latching device will generally comprise a master and slave latch with the further latching element being configured to operate on the same clock signal as the slave latch. This ensures that it is oppositely clocked to the master latch and provides the required delay to the diagnostic data being input to the master latch.

In some embodiments, said latching device comprises a first and second inverter, said clock signal received at said latching device being inverted by said first inverter to generate said first clock signal and being inverted by said second inverter to generate said second clock signal.

Generally when clock signals are received at latching devices they are inverted a number of times before being used in order to clean the signal. Thus, the latching device has a first inverter that inverts the signal before inputting it to the input latching element and a second inverter that inverts a signal before inputting it to the output latching element and the further latching element.

In some embodiments, said first value of said clock signal is a high value of said clock signal and said second value of said clock signal is a low value of said clock signal.

Although, it should be clear to the skilled person that the latching elements may become transparent on any value of the clock signal and opaque on the other, in some embodiments they are transparent on the high value of the clock signal and opaque on the low value.

In some embodiments, said latching device further comprises:

an input for receiving a data retention enable signal indicating said latching device is to enter a low power mode in which said input and output latching elements are powered down; and a further selecting device for selecting between diagnostic data and an output of said input latching element for input to said further latch in response to a value of said diagnostic enable signal; wherein said latching device is configured in response to said data retention enable signal indicating data retention and said diagnostic enable signal indicating said functional mode to transmit data output from said input latching element via said further selecting device to said further latching element prior to powering down said input and output latching elements, said further latching element being configured to retain data in a low power mode.

The present technique recognises that retention latches are available that comprise a further latch that is used for retaining data in low power mode when the input and output latching elements are powered down. It also recognises that low power mode is not used during diagnostic operations and thus, during diagnostic operations there is a latching element in these data retention latches that is not required. Thus, in embodiments of the present invention the further latching element serves both as the data retention latching element in data retention mode and as the input latching element on the diagnostic path in diagnostic mode. This design provides a latching device that addresses hold violation times in diagnostic mode and can retain data in data retention mode with only the addition of a selecting device for selecting between the different modes and for controlling the further latch accordingly.

In some embodiments, said latching device comprises a second further selecting device for selecting said second clock signal for input to a clock input of said further latching device in response to said scan enable signal indicating said diagnostic mode and for selecting a signal having said second value for input to said clock input in response to said data retention enable signal indicating said latching device is to enter a low power mode, such that said further latching device is opaque.

Where the further latching device is used in this way then a selecting device may be used to either input the second clock signal to the latching device in diagnostic mode or to input a constant value signal that will render the latching device opaque in response to the signal indicating data retention mode. In this way, the further latching device is clocked in diagnostic mode and can receive and output data to the input latching element while in data retention mode it is not clocked but is held opaque such that it holds the data value that it previously received until low power mode is exited.

In some embodiments, said signal having said second value comprises said data retention enable signal.

The signal required to render the further latching element opaque must have a constant value and thus, in some embodiments the data retention enable signal is used as this will have a constant value during low power mode.

Although the further latching element may be formed in a number of ways provided it can retain power in low power mode, in some embodiments it is a balloon latch.

In some embodiments, the latching device comprises a first transmission gate arranged between said input latching element and said output latching element and being configured to be open in response to said data retention enable signal not indicating a low power mode and configured to be closed in response to said data retention enable signal indicating a low power mode, and a second transmission gate arranged between said further latching element and said output latching element and configured to be open in response to said data retention enable signal indicating a low power mode and closed in response to said data retention enable signal not indicating a low power mode.

In order to control data flow between the input latching element, the output latching element and the further latching element in diagnostic mode and in data retention mode transmission gates that are controlled by the data retention mode enable signal can be used to either provide a connection between the latching elements or to provide an open circuit as appropriate.

In some embodiments, said input latching element, said output latching element and said further latching element comprise reset latching elements having a reset input for resetting said latching element to store a predetermined value.

The present technique is also applicable to reset latching elements where an additional signal forces the element to store a predetermined value. In such a case it is important that the further latching element is also formed in this way so that the predetermined value is stored in this latch too. As the further latching element acts to latch the input data in the diagnostic mode it too should store the predetermined value following reset.

In some embodiments, said latching device is configured as a standard cell layout arranged to fit into a standard placement site on an integrated circuit.

In the design of semiconductor integrated circuits, circuit designers commonly use what are known as standard cells to achieve a particular logical function. Standard cells are essentially pre-designed layouts of transistors that are wired to perform a certain type of logical function. They are designed such that their boundary conditions are standard so that they can interact with each other in a manufacturable way and thus, any standard cell can be placed on any placement site in a standard cell block. In this way a designer can position the standard cells required for a system in any appropriate placement site without needing to worry about interactions with a neighbouring cell. Latching elements according to the present technique can be designed as standard cells to fit into a standard placement site and can therefore be used in circuits formed of such cells.

A second aspect of the present invention provides an integrated circuit comprising a plurality of standard cells arranged in standard cell placement sites to form a logical system, at least one of said standard cells comprising a standard cell comprising a latching device according to a first aspect of the present invention.

A third aspect of the present invention provides a synchronous data processing apparatus comprising a plurality of latching devices and combinational circuitry for processing operational data;

said plurality of latching devices being configured when said data processing apparatus is operating in a functional mode:

to receive said operational data from a portion of said combinational circuitry and to transmit said data to a further portion of said combinational circuitry in response to a clock signal, such that said operational data values processed by said combinational circuitry are transmitted synchronously through said data processing apparatus in response to a clock signal; and when said data processing apparatus is operating in a diagnostic mode to pass diagnostic data values between said latching devices along a diagnostic path in response to said clock signal; wherein at least some of said latching devices are latching devices according to a first aspect of the present invention.

The latching devices may be used in a data processing apparatus along with combinational circuitry. It may be appropriate to use latching devices according to an aspect of the present invention where hold timing violations are expected and to use conventional latching devices where they are not. In this regard, conventional latching devices have a smaller area and thus, where hold timing violations are not expected they may be more appropriate.

In this regard, the length of diagnostic paths between the latching elements may provide an indication of whether a hold time violation is likely or not and those latching devices with shorter diagnostic paths between them which may be more likely to have hold timing violations may be formed of latching devices according to an embodiment of the present invention.

A fourth aspect of the present invention provides a method of receiving, holding and outputting a data value in response to a clock signal, said clock signal periodically switching between a first and a second value, said method comprising:

receiving an input data value at an input latching element; and outputting said data value at an output latching element; wherein said input latching element is configured to receive a first clock signal and said output latching element is configured to receive a second clock signal, said first and second clock signals having a same frequency and phase but being inverted with respect to each other, such that:

in response to said first clock signal having said first value said input latching element receives and transmits said input data to said output latching element; and in response to said second clock signal having said first value said output latching element receives and transmits said data from said input latching element to said output;

said method further comprising an initial step of:

selecting an operational data value or a diagnostic data value for input to said input latching element in response to a value of a diagnostic enable signal indicating a functional mode or a diagnostic mode; and where said diagnostic enable signal indicates a diagnostic mode receiving said diagnostic data at a further latching element and transmitting said diagnostic data to said input latching element in response to said second clock signal having said first value.

A fifth aspect of the present invention provides a latching means for receiving, holding and outputting a data value in response to a clock signal, said clock signal periodically switching between a first and a second value, said latching means comprising:

an input latching means for receiving an input data value; and an output latching means for outputting said data value; wherein said input latching means is configured to receive a first clock signal and said output latching means is configured to receive a second clock signal, said first and second clock signals having a same frequency and phase but being inverted with respect to each other; wherein said input and output latching means are each configured to be transparent and transmit data between an input and an output in response to said first value of a received clock signal and being opaque and holding said data value in response to a second value of said received clock signal, such that in response to said first and second clock signals said input data value is clocked through said input and output latching elements to said output; said latching means further comprising:

a selecting means for selecting an operational data value or a diagnostic data value for input to said input latching means in response to a value of a diagnostic enable signal indicating a functional mode or a diagnostic mode; and a further latching means clocked by said second clock signal and for transmitting data between an input and an output in response to said second clock signal having said first value and holding said data value in response to said second clock signal having said second value.

The above, and other objects, features and advantages of this invention will be apparent from the following detailed description of illustrative embodiments which is to be read in connection with the accompanying drawings.

BRIEF DESCRIPTION OF THE DRAWINGS

FIG. 6b shows a table indicating operational states of the latching device shown in FIG. 6a;

DESCRIPTION OF THE EXAMPLE
NON-LIMITING EMBODIMENTS

Figure 2:
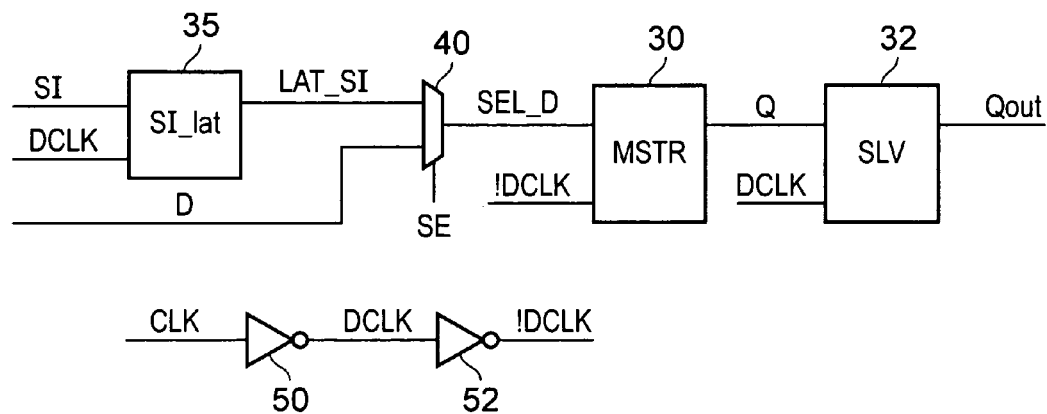
FIG. 2 schematically shows a latching device according to an embodiment of the present invention.

FIG. 2 shows a latching device according to an embodiment of the present invention. This latching device has master and slave latches 30 and 32 that are clocked by clocks of opposite phase and it also has an additional scan latch 35 that is on the scan path and latches the scan input signal. Thus, if scan enable is not enabled an input data value passes through multiplexer 40 and is then clocked through master slave latch 30, 32 in a conventional manner. If however scan is enabled and the diagnostic mode of operation is selected then the input at the scan input SI is selected at multiplexer 40. The value that is input to the multiplexer 40 is the latched value of the scan input signal that has passed through the scan latch 35. This scan latch is clocked by the same phase of the clock signal as the slave latch 32 and this ensures that hold time violations do not occur.

Figure 1:
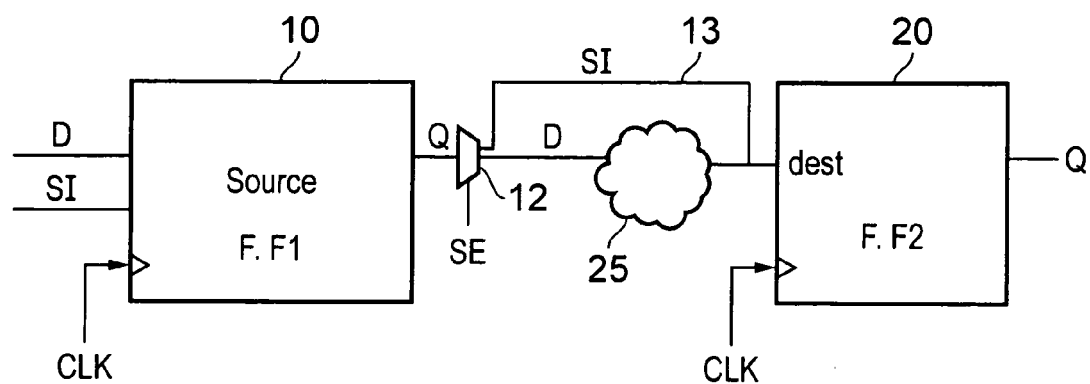
FIG. 1 schematically shows operational data and diagnostic data being transmitted between two flip flops and the timing of this data and devices of the prior art.
Figure 1:
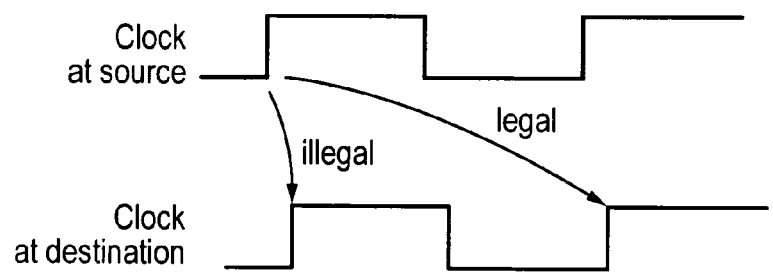
Figure 3:
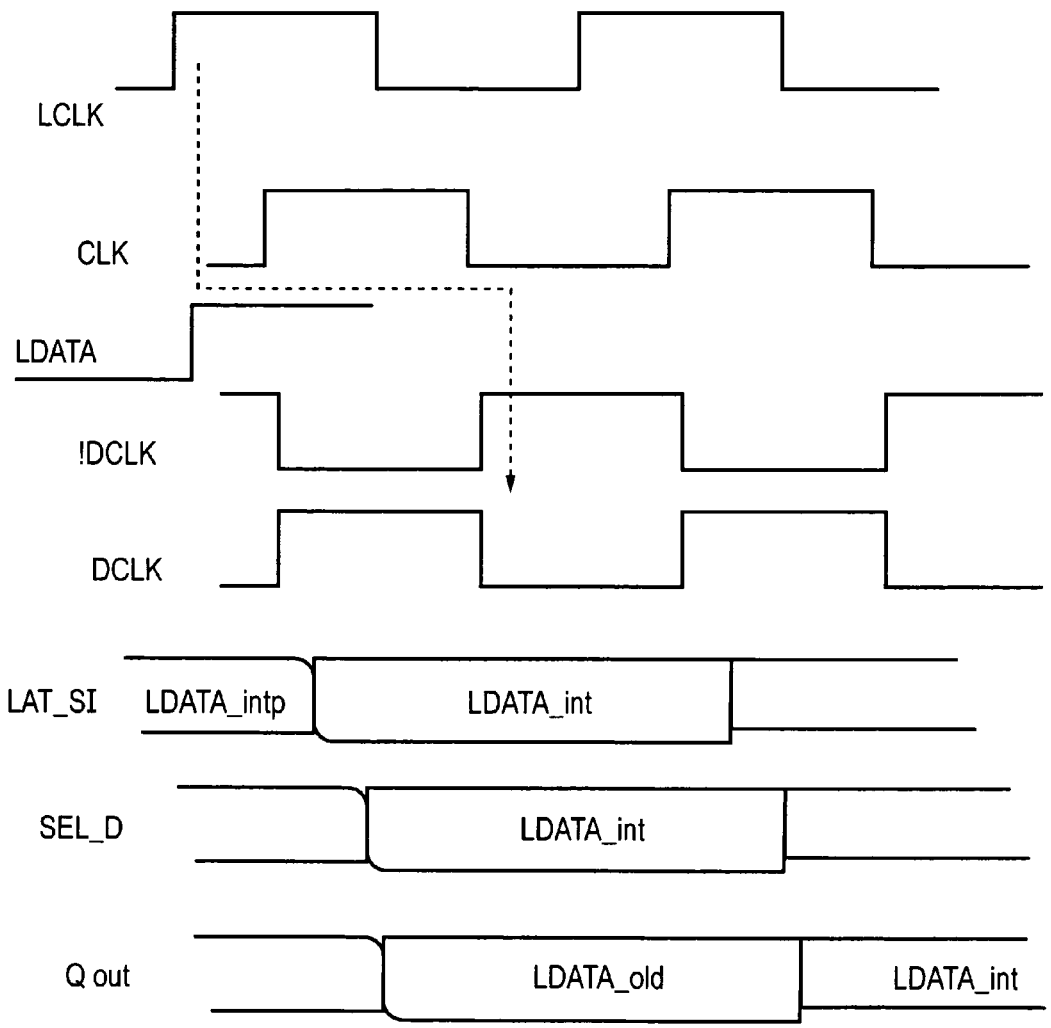
FIG. 3 schematically shows a timing diagram illustrating the timing of data latching in and out of the latching device of FIG. 2 in diagnostic mode.

This can be shown with respect to FIG. 3 which shows a timing diagram of the signals of the circuit of FIG. 1, which is arranged such that the second flip flop FF" is one according to an embodiment of the present invention such as is shown in FIG. 2. A launch clock LCLK launches the data to be shifted (and corresponds to the clock of FF1) and CLK is the clock that captures it at the input of the capture element (and corresponds to the clock clocking FF2 as is detailed below).

DCLK and !DCLK clock the latching elements of FF2 and are generated from the clock signal CLK by inverters as shown in FIG. 2, DCLK being in phase with CLK and !DCLK being an inverted form of CLK.

LDATA is the data arriving at the input SI of the second flip flop FF2. As this is a flip flop according to an embodiment of the invention there is an additional SI latch at the input that is clocked by the slave clock DCLK. LDATA is therefore captured when DCLK is high and is transferred via multiplexer 40 (of FIG. 2) to the input of the master latch as signal SEL-D. This is captured by the MSTR 30 when !DCLK is high and therefore DCLK is low and this signal is in turn captured by slave 32 and output at the output of the second flip flop FF2 of FIG. 1 when DCLK goes high. Thus, as can be seen from the timing diagram the data LDATA_int arrives at the output of the second flip flop with a half cycle delay due to the additional latch on the SI input.

Figure 4A:
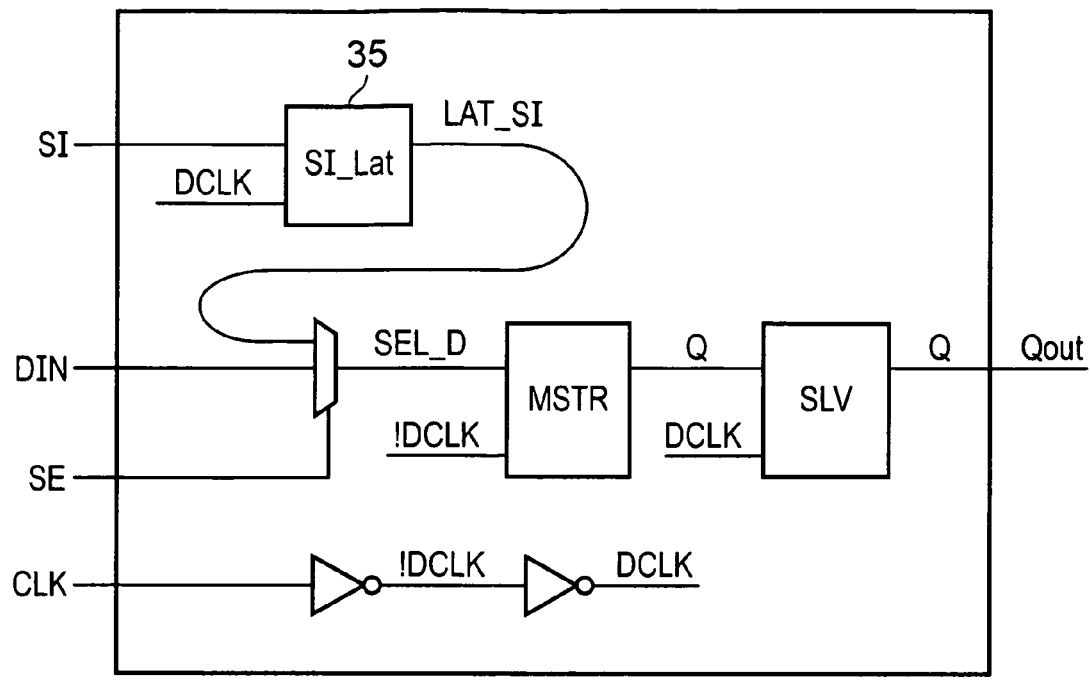
FIG. 4a shows a latching device according to an embodiment of the present invention.
Figure 4B:
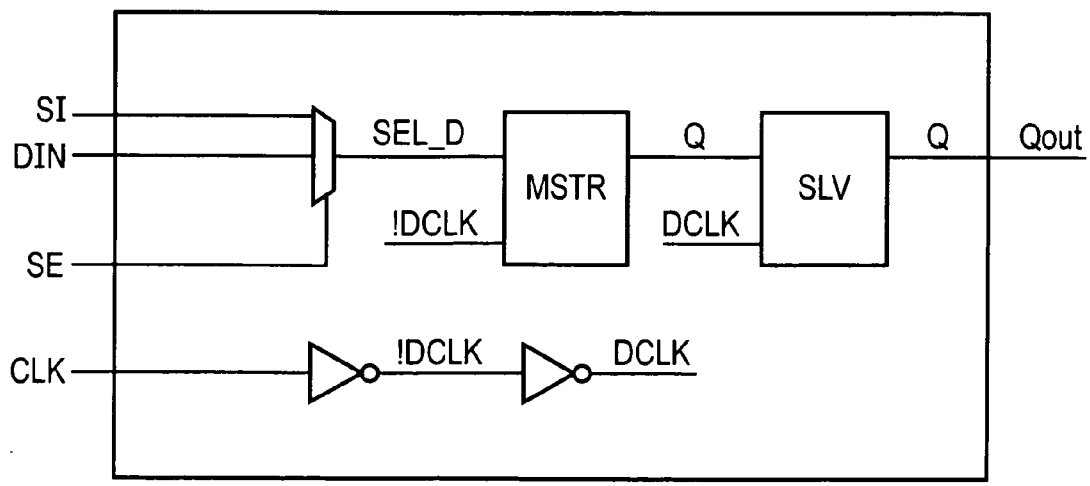
FIG. 4b shows a corresponding latching device according to the prior art.

FIG. 4a shows a latching device according to an embodiment of the present invention compared to a conventional latching device which is shown in FIG. 4b. As can be seen a latching device according to an embodiment of the present invention shown in FIG. 4a is very similar to the conventional latching device of FIG. 4b except for the addition of the scan latch 35 on the scan input. Thus, it has the same input and output ports but will require a slightly larger area to accommodate the scan latch 35. The similarity to a conventional latch is advantageous as it means that this latching device can be used as a standard cell in conjunction with conventional latching devices in locations where hold timing violations are considered to be likely. Thus, circuits can be designed that employ this technique to avoid timing violations without unduly increasing area, by using this latching device in places where timing violations are likely and conventional latching devices where it is considered that they are unlikely.

Figure 5:
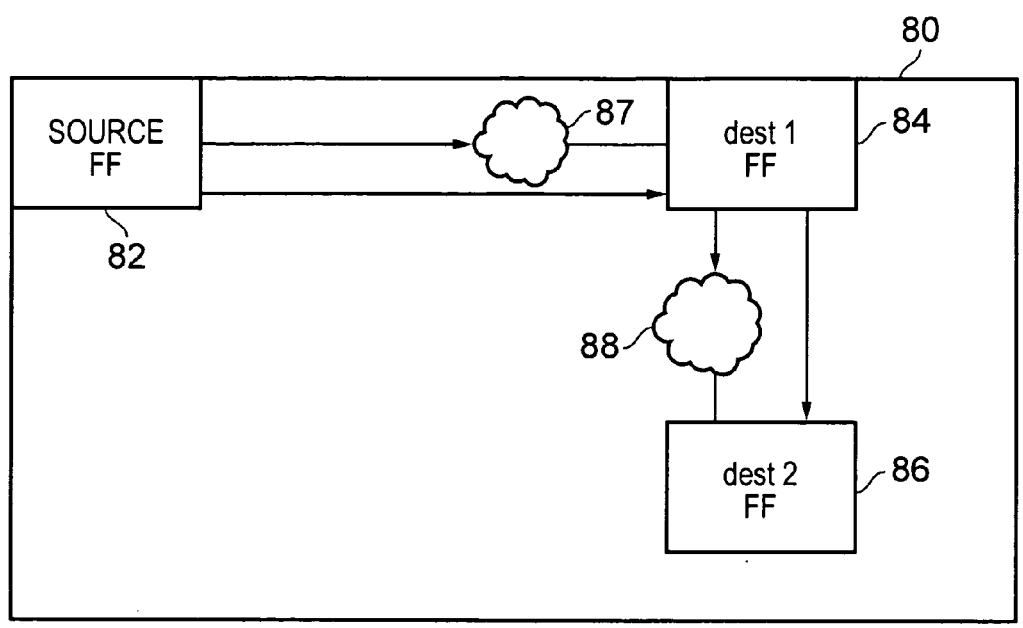
FIG. 5 shows schematically a data processing apparatus formed of standard cells, some of which are latching devices according to an embodiment of the present invention.

FIG. 5 shows the outline of a data processing apparatus 80 according to an embodiment of the present invention in a schematic form. This shows flip flops 82, 84 and 86 which transmit either data signals via combinational circuitry 87 and 88 or scan signals directly between the flip flops. As can be seen owing to the arrangement of the flip flops the scan path between the flip flops 82 and 84 is a lot longer than that between flip flops 84 and 86. Thus, it is more likely that there will be a hold timing violation on the path between flip flops 84 and 86. Thus, in embodiments of the present invention it may be advantageous to utilise a flip flop such as that shown in FIG. 4a as the flip flop 86 in the data processing apparatus while flip flops 82 and 84 may be conventional flip flops as shown in FIG. 4b.

It should also be noted that in some embodiments conventional flip flops may be used with perhaps a single or a couple of buffers on the scan path as in devices of the prior art where there is thought to be a small chance of a hold timing violation, while flip flops according to an embodiment of the present invention can be used where the chance of a hold timing violation is higher and where the chance is very low then conventional flip flops with no buffers can be used.

Figure 6A:
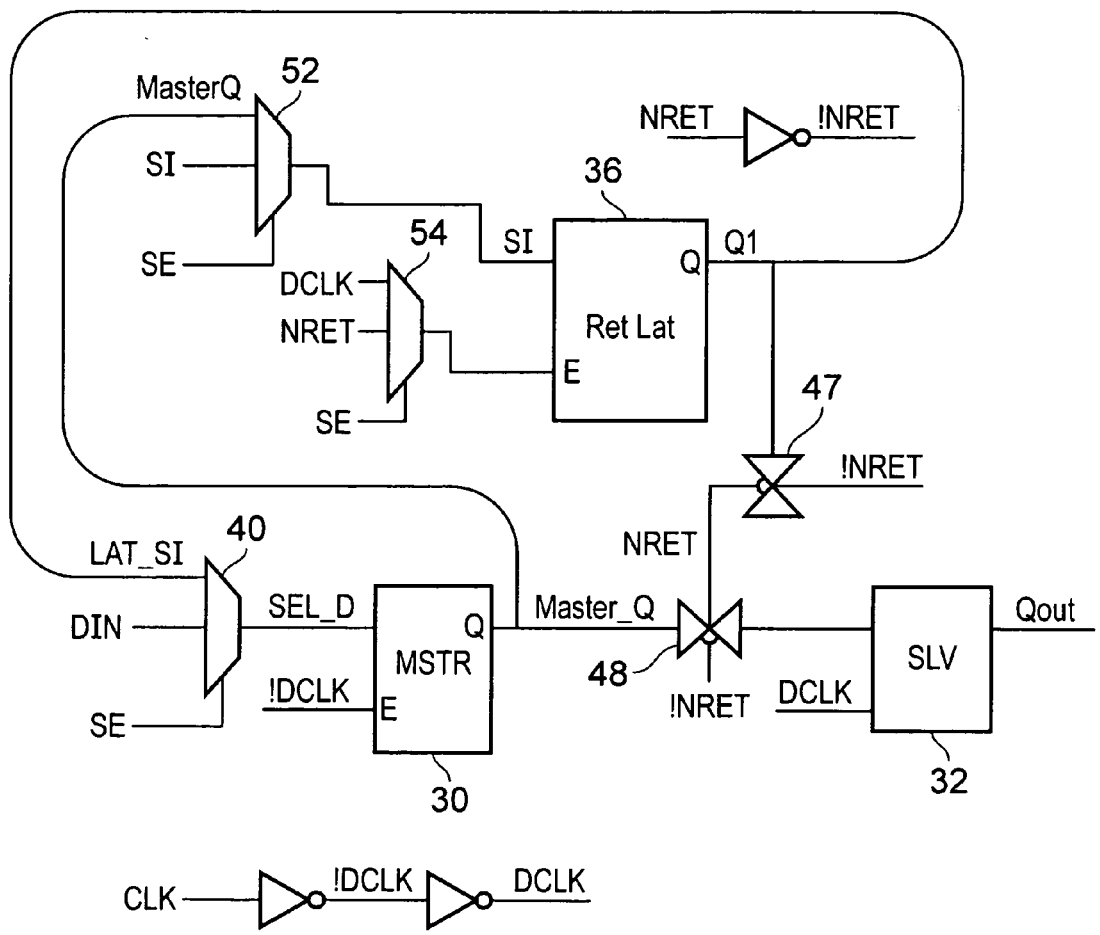
FIG. 6a shows a latching device having retention capabilities according to an embodiment of the present invention.

FIG. 6a shows a latching device according to an embodiment of the present invention that has retention capabilities.

This latching device comprises a master latch 30 and a slave latch 32 as in a conventional flip flop and it also comprises an additional latch 36 that is a balloon latch that can be used to retain data in low power mode. In this embodiment, this balloon latch is also used as the scan latch during scan mode to delay the diagnostic data received at the scan input and prevent hold timing violations. In this way, a single latch can be used for both data retention in functional mode and for avoiding hold timing violations in scan mode. In this way a multiple function latch is achieved with an efficient use of circuit area.

In this regard, the present technique recognises that data retention is not required during scan mode and thus, the retention latch 36 will not be used for data retention in this mode and is therefore available for use as the scan latch shown as 35 in FIG. 2. Thus, with a few additional multiplexers this latch can be used either as a retention latch or as a diagnostic delay latch depending on the mode of operation.

Thus, in diagnostic mode when the scan enable signal is high, multiplexer 52 will select the scan input signal to input to latch 36 and multiplexer 54 will select the DCLK clock which is the clock that clocks the slave latch 32 to clock the retention latch 36. Multiplexer 40 will select the scan signal output from latch 36 as an input to master latch 30. Thus, when DCLK goes high retention latch 36 will become transparent and will receive the data at the scan input SI. This will be transmitted via multiplexer 40 to master latch 30. However, while the retention latch 36 is transparent the master latch 30 will be opaque as it is clocked by the inverted clock signal !DCLK and therefore, it will not receive the scan data until the inverted clock !DCLK goes high. At this point master latch 30 becomes transparent and will receive the data. This will be transmitted via transmission gate 48 to slave latch 32 which will receive this data when the clock signal DCLK goes high (at which point !DCLK goes low). In this way the scan data is transmitted through the latching device in the same way as occurred in the device of FIG. 2. With regard to transmission gate 48, this is turned on and off by the data retention signal which indicates a low power mode and thus, during functional and diagnostic mode it is turned on and therefore the master 30 is connected to slave 32.

Operation in functional mode will now be described. When scan is not enabled and the scan enable signal is low, multiplexer 40 will select the data input DIN and input it to the master latch 30. As at this point data retention is not required and the device is not to be powered down NRET is high and therefore transmission gate 48 is open and the data is clocked from the master latch 30 to the slave latch 32 in response to the clock signal. Furthermore, the additional latch 36 is not currently required and multiplexer 54 transmits the data retention signal NRET to the retention latch clocking input such that it is not currently clocked but is transparent as NRET is high. Multiplexer 52 selects the output of the master latch 30 to input to the additional latch 36 as scan enable is low.

When NRET goes low indicating low power mode is to be entered then transmission gate 48 will close. Similarly, retention latch 36 will receive a low signal on the clocking signal and will become opaque. It will therefore retain the data that it had previously received from the output of the master latch. The master latch can now be powered down along with the slave latch. When NRET is low transmission gate 47 is open and therefore, the slave latch 32 will see the data that is held in retention latch 36. However, in low power mode the master and slave latches will both be powered down and not retain any power. However, on power up they will be powered up and the slave latch 32 will receive the data from the retention latch 36 via the open transmission gate 47. When NRET then goes high indicating functional mode is to recommence transmission gate 47 will close and transmission gate 48 will open and data input via multiplexer 50 will once again be clocked through the master and slave. However, initially the slave latch 32 will hold the data that was stored in the retention or balloon latch 36 and thus, the previous data will have been restored.

FIG. 6b shows a table illustrating the different states of the additional latch 36 in scan, functional and data retention modes. Thus, state 1 is a functional non-retention state so scan enable is 0 and NRET is 1. At this point the balloon latch is transparent for the functional state and will receive any state from the master and this will be available on its output. However, in this state the transmission gate 47 is closed and thus, it will not transmit this data to the slave latch 32.

In state 2 scan enable is still 0 so the device is not in diagnostic mode however NRET is 0 indicating low power data retention mode is entered. At this point the balloon latch becomes opaque as the NRET signal is input to the clock input of the balloon latch 36 and it therefore retains the previously held functional state. At this point transmission gate 47 is open so this state is available at the input to the slave latch, however master and slave latch are currently powered down.

State 3 is the diagnostic state when scan enable is 1 and there is no low power mode thus NRET is 1. In this mode the balloon latch operates to retime the scan input by serving as a scan latch 35 as in FIG. 2 and thus, receives the scan input in response to the clock clocking the slave latch being high and outputs this to the master latch 30, thereby introducing a half clock cycle delay into the scan path. State 4 is when NRET is low indicating low power mode during scan mode. This is not something that generally occurs as low power mode is not required during scan.

Figure 7:
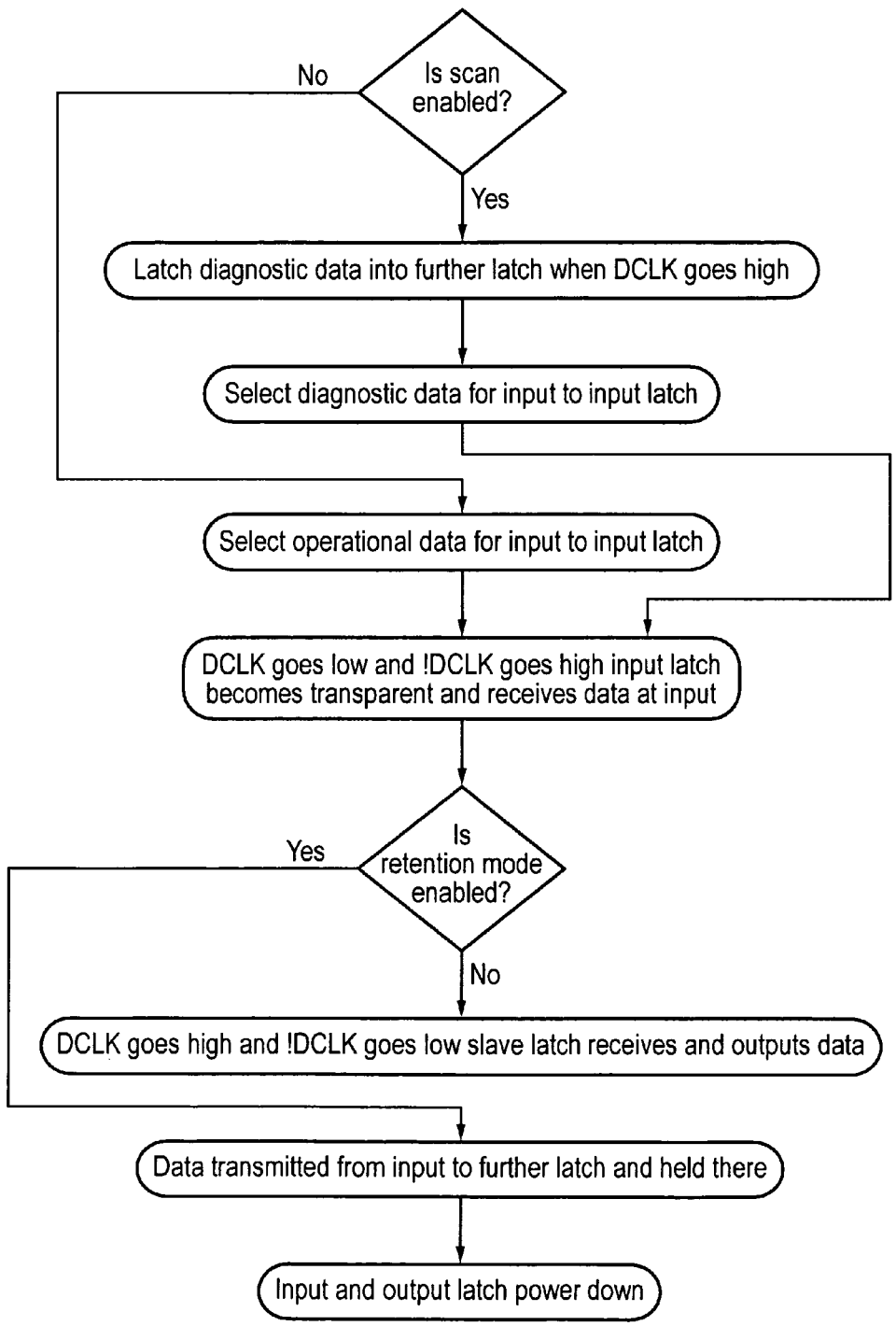
FIG. 7 shows a flow diagram illustrating steps in a method for latching data according to an embodiment of the present invention.

FIG. 7 shows a flow diagram illustrating steps in a method according to an embodiment of the present invention. Initially it is determined if scan is enabled or not. If it is enabled then diagnostic data received at the scan input is latched into the further latch when the second clock DCLK goes high. This diagnostic data is then selected as the data to be input to the input latch.

If scan is not enabled then it is the operational data that is selected for input to the input latch.

When the second clock DCLK goes low then the inverse of this clock !DCLK goes high and the master latch will become transparent and will receive the data at its input. This will be the scan data in the scan mode and the diagnostic data in the diagnostic mode.

It is then determined if the retention mode is enabled. It should be noted that during scan mode retention mode will not be enabled and thus, one would always follow the no line. If retention mode is not enabled when the second clock DCLK goes high and its inverted clock !DCLK goes low the slave latch receives and outputs data from the master.

If (during operational mode) data retention mode is enabled then the data is transmitted from the master to the further latch and it is held there. The input and output latches are then powered down.

Figure 8:
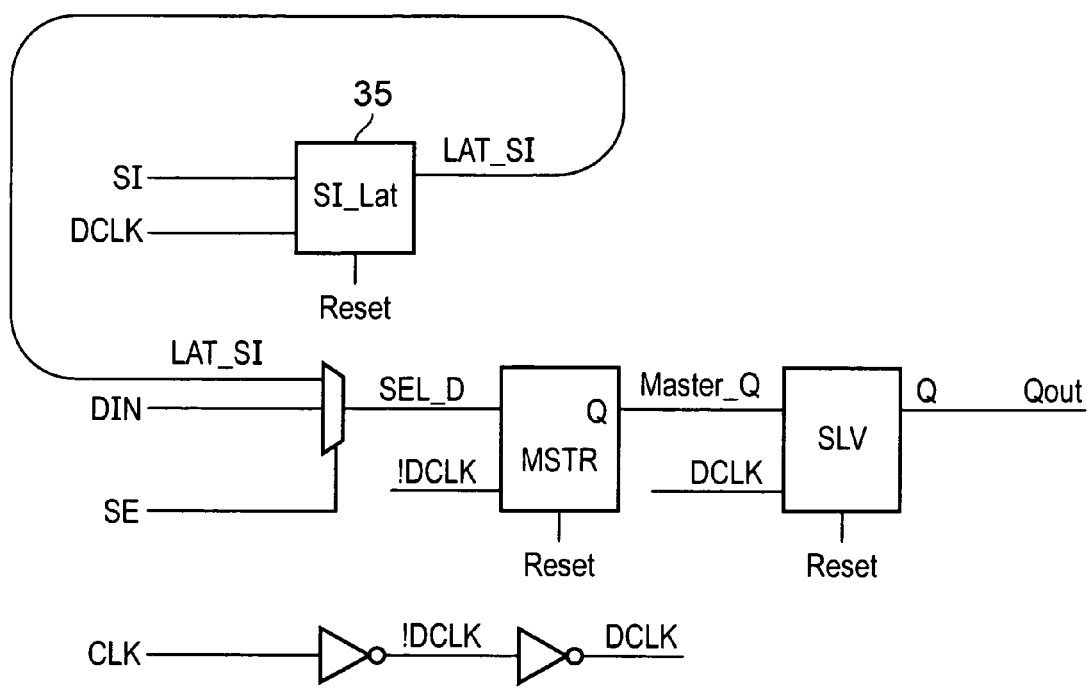
FIG. 8 shows a latching device formed of reset latching elements according to an embodiment of the present technique.

FIG. 8 shows an alternative embodiment where each latch in the flip flop comprises a reset input for resetting the latches to a predetermined value. In this case, the present technique will still function correctly provided that the additional latch on the scan input is also a reset latch. Reset latches can be used where it is important at certain points that the system can be loaded with a predetermined value. If the latches are to function correctly then the additional latch 35 will also need this property otherwise it may be storing a different value which when scan is initiated will propagate along the diagnostic path.

Although illustrative embodiments have been described in detail herein with reference to the accompanying drawings, it is to be understood that the claims are not limited to those precise embodiments, and that various changes and modifications can be to effected therein by one skilled in the art without departing from the scope and spirit of the appended claims. For example, various combinations of the features of the following dependent claims could be made with the features of the independent claims.

We claim:

1. A latching device configured to receive, hold and output a data value in response to a clock signal, said clock signal periodically switching between a first and a second value, said latching device comprising:
an input latching element configured to receive an input data value; and
an output latching element configured to output said data value; wherein
said input latching element is configured to receive a first clock signal and said output latching element is configured to receive a second clock signal, said first and second clock signals having a same frequency and phase but being inverted with respect to each other; wherein said input and output latching elements are each configured to be transparent and transmit data between an input and an output in response to said first value of a received clock signal and being opaque and holding said data value in response to a second value of said received clock signal, such that in response to said first and second clock signals said input data value is clocked through said input and output latching elements to said output; said latching device further comprising:
- a selecting device for selecting an operational data value or a diagnostic data value for input to said input latching element in response to a value of a diagnostic enable signal indicating a functional mode or a diagnostic mode; and
- a further latching element configured to be clocked by said second clock signal and being configured to be transparent and transmit data between an input and an output in response to said second clock signal having said first value and being opaque and holding said data value in response to said second clock signal having said second value, wherein said further latching element is configured to receive said second clock signal in response to said diagnostic enable signal indicating said diagnostic mode.

2. A latching device according to claim 1, wherein said input latching element is a master latch and said output latching element is a slave latch, said further latching element being configured to operate in response to a same clock signal as said slave latch.

3. A latching device according to claim 1, wherein said latching device comprises a first and second inverter, said clock signal received at said latching device being inverted by said first inverter to generate said first clock signal and being inverted by said second inverter to generate said second clock signal.

4. A latching device according to claim 1, wherein said first value of said clock signal is a high value of said clock signal and said second value of said clock signal is a low value of said clock signal.

5. A latching device according to claim 1, wherein said input latching element, said output latching element and said further latching element comprise reset latching elements having a reset input for resetting said latching element to store a predetermined value.

6. A latching device according to claim 1, said latching device being configured as a standard cell layout arranged to fit into a standard placement site on an integrated circuit.

7. An integrated circuit comprising a plurality of standard cells arranged in standard cell placement sites to form a logical system, at least one of said standard cells comprising a standard cell according to claim 6.

8. A synchronous data processing apparatus comprising a plurality of latching devices and combinational circuitry for processing operational data;
- said plurality of latching devices being configured when said data processing apparatus is operating in a functional mode:
- to receive said operational data from a portion of said combinational circuitry and to transmit said data to a further portion of said combinational circuitry in response to a clock signal, such that said operational data values processed by said combinational circuitry are transmitted synchronously through said data processing apparatus in response to a clock signal; and
- when said data processing apparatus is operating in a diagnostic mode to pass diagnostic data values between said latching devices along a diagnostic path in response to said clock signal; wherein
- at least some of said latching devices are latching devices according to claim 1.

9. A synchronous data processing apparatus according to claim 8, wherein said latching devices are arranged within said data processing apparatus such that a length of said diagnostic path between neighbouring latching devices is dependent on their location, said data processing apparatus being configured such that latching devices that receive said diagnostic data from shorter diagnostic paths are latching devices according to claim 1 and latching devices that receive said diagnostic data from longer diagnostic paths comprise an input latching element and an output latching element arranged as a flip flop.

10. A synchronous data processing apparatus according to claim 8, said data processing apparatus being configured to operate in a low power retention mode in which at least a portion of said data processing apparatus is powered down, state being retained in retention latching elements, wherein at least some of said latching devices comprise latching devices, wherein said first value of said clock signal is a high value of said clock signal and said second value of said clock signal is a low value of said clock signal, said retention latching elements comprising:
- an input for receiving a data retention enable signal indicating said latching device is to enter a low power mode in which said input and output latching elements are powered down; and
- a further selecting device for selecting between diagnostic data and an output of said input latching element for input to said further latch in response to a value of said diagnostic enable signal; wherein
- said latching device is configured in response to said data retention enable signal indicating data retention and said diagnostic enable signal indicating said functional mode to transmit data output from said input latching element via said further selecting device to said further latching element prior to powering down said input and output latching elements, said further latching element being configured to retain data in a low power mode.

11. A latching device configured to receive, hold and output a data value in response to a clock signal, said clock signal periodically switching between a first and a second value, said latching device comprising:
- an input latching element configured to receive an input data value; and
- an output latching element configured to output said data value; wherein
- said input latching element is configured to receive a first clock signal and said output latching element is configured to receive a second clock signal, said first and second clock signals having a same frequency and phase but being inverted with respect to each other; wherein
- said input and output latching elements are each configured to be transparent and transmit data between an input and an output in response to said first value of a received clock signal and being opaque and holding said data value in response to a second value of said received clock signal, such that in response to said first and second clock signals said input data value is clocked through said input and output latching elements to said output; said latching device further comprising:
- a selecting device for selecting an operational data value or a diagnostic data value for input to said input latching element in response to a value of a diagnostic enable signal indicating a functional mode or a diagnostic mode; and a further latching element configured to be clocked by said second clock signal and being configured to be transparent and transmit data between an input and an output in response to said second clock signal having said first value and being opaque and holding said data value in response to said second clock signal having said second value, wherein said latching device further comprises:

an input for receiving a data retention enable signal indicating said latching device is to enter a low power mode in which said input and output latching elements are powered down; and a further selecting device for selecting between diagnostic data and an output of said input latching element for input to said further latch in response to a value of said diagnostic enable signal; wherein said latching device is configured in response to said data retention enable signal indicating data retention and said diagnostic enable signal indicating said functional mode to transmit data output from said input latching element via said further selecting device to said further latching element prior to powering down said input and output latching elements, said further latching element being configured to retain data in a low power mode.

12. A latching device according to claim 11, said latching device comprising a second further selecting device for selecting said second clock signal for input to a clock input of said further latching device in response to said scan enable signal indicating said diagnostic mode and for selecting a signal having said second value for input to said clock input in response to said data retention enable signal indicating said latching device is to enter a low power mode, such that said further latching device is opaque.

13. A latching device according to claim 12, wherein said signal having said second value comprises said data retention enable signal.

14. A latching device according to claim 11, said further latching element comprising a balloon latch.

15. A latching device according to claim 11, comprising a first transmission gate arranged between said input latching element and said output latching element and being configured to be open in response to said data retention enable signal not indicating a low power mode and configured to be closed in response to said data retention enable signal indicating a low power mode, and a second transmission gate arranged between said further latching element and said output latching element and configured to be open in response to said data retention enable signal indicating a low power mode and closed in response to said data retention enable signal not indicating a low power mode.

16. A method of receiving, holding and outputting a data value in response to a clock signal, said clock signal periodically switching between a first and a second value, said method comprising:

receiving an input data value at an input latching element; and outputting said data value at an output latching element; wherein said input latching element is configured to receive a first clock signal and said output latching element is configured to receive a second clock signal, said first and second clock signals having a same frequency and phase but being inverted with respect to each other, such that:

in response to said first clock signal having said first value said input latching element receives and transmits said input data to said output latching element; and in response to said second clock signal having said first value said output latching element receives and transmits said data from said input latching element to said output;

said method further comprising an initial step of:

selecting an operational data value or a diagnostic data value for input to said input latching element in response to a value of a diagnostic enable signal indicating a functional mode or a diagnostic mode; and where said diagnostic enable signal indicates a diagnostic mode receiving said diagnostic data at a further latching element and transmitting said diagnostic data to said input latching element in response to said second clock signal having said first value, wherein said latching device comprises an input for receiving a data retention enable signal indicating said latching device is to enter a low power mode; said method comprising the further steps of in response to said scan enable signal indicating a functional mode of operation selecting an output of said input latching element for input to said further latch; and in response to said data retention signal indicating a low power mode is to be entered transmitting data output from said input latching element to said further latching element prior to powering down said input and output latching elements down, said further latching element retaining said data during low power mode.

17. A method according to claim 16, said method comprises the further steps of:

in response to receiving a signal indicating said low power mode is to exited transmitting said data stored in said further latching element to said output latching element.

18. A latching means for receiving, holding and outputting a data value in response to a clock signal, said clock signal periodically switching between a first and a second value, said latching means comprising:

an input latching means for receiving an input data value; and an output latching means for outputting said data value; wherein said input latching means is configured to receive a first clock signal and said output latching means is configured to receive a second clock signal, said first and second clock signals having a same frequency and phase but being inverted with respect to each other; wherein said input and output latching means are each configured to be transparent and transmit data between an input and an output in response to said first value of a received clock signal and being opaque and holding said data value in response to a second value of said received clock signal, such that in response to said first and second clock signals said input data value is clocked through said input and output latching elements to said output; said latching means further comprising:

a selecting means for selecting an operational data value or a diagnostic data value for input to said input latching means in response to a value of a diagnostic enable signal indicating a functional mode or a diagnostic mode; and a further latching means clocked by said second clock signal and for transmitting data between an input and an output in response to said second clock signal having said first value and holding said data value in response to said second clock signal having said second value, wherein said further latching means is configured to receive said second clock signal in response to said diagnostic enable signal indicating said diagnostic mode.

* * * * *